United States Patent
He

(10) Patent No.: US 7,599,978 B2
(45) Date of Patent: Oct. 6, 2009

(54) DIGITAL SIGNAL DECIMATION BY SUBSPACE PROJECTION

(75) Inventor: Shousheng He, Södra Sandby (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 823 days.

(21) Appl. No.: 10/883,671

(22) Filed: Jul. 6, 2004

(65) Prior Publication Data

US 2006/0010185 A1  Jan. 12, 2006

(51) Int. Cl.
*G06F 17/17* (2006.01)
(52) U.S. Cl. .................. 708/313; 708/290; 708/300
(58) Field of Classification Search .......... 708/313, 708/290, 190, 300
See application file for complete search history.

(56) References Cited

U.S. PATENT DOCUMENTS

| | | | | | |
|---|---|---|---|---|---|
| 4,893,316 | A | * | 1/1990 | Janc et al. ............... | 708/300 |
| 4,989,221 | A | * | 1/1991 | Qureshi et al. ........... | 375/222 |
| 5,025,404 | A | * | 6/1991 | Janssen et al. ........... | 708/290 |
| 5,483,555 | A | * | 1/1996 | Hattori .................... | 375/327 |
| 5,493,297 | A | | 2/1996 | Nguyen et al. | |
| 5,598,159 | A | | 1/1997 | Hein | |
| 6,134,569 | A | * | 10/2000 | Kot ........................ | 708/3 |
| 6,178,186 | B1 | * | 1/2001 | Baker et al. .............. | 370/517 |
| 6,531,969 | B2 | * | 3/2003 | Chu ........................ | 341/61 |

2003/0108028 A1  6/2003  Brunner et al.

FOREIGN PATENT DOCUMENTS

DE  10051144 A1  4/2002

OTHER PUBLICATIONS

Stoica, P., Nordsjo, A.E. "Subspace-based frequency estimation in the presence of moving-average noise using decimation", vol. 63, pp. 211-220. *Signal Processing* (Netherlands), Dec. 1997, Elsevier for EURASIP, Netherlands.

Morren, G. et al. "Decimative subspace-based parameter estimation techniques", vol. 83, pp. 1025-1033. *Signal Processing* (Netherlands), May 2003, Elsevier for EURASIP, Netherlands.

E. Lindskog, C. Tidestav, "Reduced Rank Channel Estimation", *IEEE Proc. VTC'99*, pp. 1126-1130, May 17-19, 1999 (Houston, TX).

A.F. Naguib, et al., "Adaptive Channel Equalization for TDMA Digital Cellular Communications Using Antenna Arrays", *Proceedings of ICASSP'94*, vol. 4, pp. 101-104, 1994 (Stanford, CA).

* cited by examiner

*Primary Examiner*—Lewis A Bullock, Jr.
*Assistant Examiner*—Michael Yaary
(74) *Attorney, Agent, or Firm*—Potomac Patent Group PLLC

(57) ABSTRACT

A digital signal, x(n) (where n is an integer), is decimated by determining a signal vector, y(k), of size M by partitioning samples of the digital signal, x(n) according to sampling phases of the samples. The signal vector, y(k), is projected onto an N-dimensional sub-space, wherein N is an integer and N<M. Where the digital signal is generated by means of oversampling, it is possible to perform decimation in a way that optimizes the signal-to-noise ratio (SNR) of the decimated signal by suitably determining the sub-space onto which the signal vector will be projected.

13 Claims, 3 Drawing Sheets

DIGITAL SIGNAL DECIMATION BY SUBSPACE PROJECTION

BACKGROUND

The present invention relates to decimation of digital signal samples, and more particularly to decimation of digital signal samples in a telecommunications receiver.

Modern communications systems rely more and more on processing communicated signals by means of digital rather than analog technology. This trend is not confined to computer-based landline networks, but is increasingly finding its way into radio telecommunications systems because of the various efficiencies associated with digital technology. For example, so-called software radios use general-purpose processors or reconfigurable pieces of digital electronics to perform significant amounts of signal processing. This enables the form of radio protocol that governs receiving and transmitting to be substantially determined by the software that is run in the transceiver. In applications such as cellular telephone communication, this characteristic is quite useful because cellular telephones may be called upon to change radio protocols in real time.

Even in radios that utilizes significant amount of digital processing, the communicated signals are in analog form as they pass between the transmitter and the receiver by means of a channel. In a typical digital radio communication receiver, the received radio signal is first demodulated (down converted) to the baseband. While it would be desirable to perform this demodulation by means of digital processing, digital electronics are presently too slow to perform this function. The Nyquist sampling theorem dictates that an ideal software radio would have to collect and process samples at twice the maximum frequency at which it is to operate. Typical radio signals are often generated in the 1 to 2 GHz range. Present-day digital technology is simply not fast enough to perform at such a high rate, at least not with technology that would be practical for commercial distribution. Consequently, demodulation is typically performed by means of analog technology.

By contrast, the baseband analog signal, generated by demodulation, oscillates at a relatively low rate (e.g., at the baseband symbol rate). It is therefore quite feasible to sample this signal, and then convert the samples into the digital domain by means of an analog-to-digital (A/D) converter. In accordance with the Nyquist sampling theorem, the rate at which the sampling is performed will determine the highest frequency component that can be recovered from the digital signal samples. Frequency components higher than this highest frequency will cause a distortion in the digital signal, called "aliasing." Because the analog signal being sampled often includes frequency components higher than the maximum recoverable frequency, the analog signal is typically first processed by an anti-aliasing filter whose purpose is to remove those excessively high frequency components.

The anti-aliasing filter is often unable to completely eliminate out-of-band noise and interference signals. To make up for this, the sampling rate selected for use in the analog-to-digital conversion process is very often higher than the rate required by the Nyquist sampling theorem. The use of a higher than necessary sampling rate is called "over-sampling." The over-sampling rate is especially high when the A/D converter uses sigma-delta modulation, which uses the very high over-sampling rate to achieve higher resolution of the digital signal.

The use of a higher-than-necessary sampling rate results in more samples being generated than are actually necessary to recover the desired information imposed on the signal. Because the digital circuitry downstream of the A/D converter assumes the presence of a digital data stream generated at the Nyquist rate rather than the higher oversampling rate, the sampling rate of the digital signal generated by the A/D is reduced by systematically eliminating some of the samples, in a process called "decimation."

FIG. 1 is a block diagram of a conventional arrangement for decimating a baseband signal. A low pass filter (LPF) 101 with a normalized cut-off frequency of $\pi/M$ is used to reduce the bandwidth of the signal before the decimator 103 is applied, where M is the decimation rate. Signal samples of a pre-determined phase of the filtered poly-phase signal are preserved and the remaining samples are cast away. Very often, the decimation operation is integrated into the LPF to form a decimation filter having reduced operations.

The conventional decimation scheme tries merely to preserve the spectrum integrity of the desired baseband signal. To do this, the Nyquist principle is applied in a purely temporal perspective. However, in real world radio communication, a transmitted signal is often subjected to multipath propagation as it passes from the transmitter to the receiver. That is, the transmitted signal can fan out in many directions when it leaves the antenna. Some part of this signal may reach the receiver's antenna via a direct path. Other parts of the transmitted signal may not initially be directed to the receiver's antenna, but may eventually arrive there as a result of being reflected off of objects in the terrain. Because these reflected signals take a longer path to reach the receiver, they are somewhat delayed relative to a direct signal. The combination of all of these variously delayed signals at the receiver's antenna results in a kind of interference that can be corrected and beneficially used by the receiver.

Thus, the oversampled poly-phase signal at the output of the low pass filter 101 also contains spatial diversity information due to the delay spreading of the physical propagation channel. This diversity information is very important for extracting desired signal from a noisy environment and/or strong interference. By casting away all signal samples except those corresponding to the pre-determined phase, the spatial diversity information is lost in the conventional decimation scheme, which results in a lower Signal-to-Noise Ratio (SNR) for the decimated signal and causes degraded Bit-Error-Rate (BER) performance for the receiver.

It is therefore desirable to provide decimation processes and apparatuses that better make use of diversity information that is present in an oversampled poly-phase signal.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses that decimate a digital signal, x(n), where n is an integer. In one aspect, this involves determining a signal vector, y(k), of size M by partitioning samples of the digital signal, x(n) according to sampling phases of the samples; and projecting the signal vector, y(k), onto an N-dimensional sub-space, wherein N is an integer and N<M.

In some embodiments in which integer decimation is desired, the value of N is set equal to 1.

In alternative embodiments, it is possible to perform fractional decimation by having N satisfy the relationship 1<N<M.

In yet another aspect, where the digital signal is generated by means of oversampling, it is possible to perform decimation in a way that optimizes the signal-to-noise ratio (SNR) of the decimated signal by suitably determining the sub-space onto which the signal vector will be projected. A way of doing this involves determining a covariance matrix $R_y$, of the signal vector y(k); and determining N eigen vectors corresponding to N greatest eigen values of the covariance matrix, $R_y$, wherein the N-dimensional sub-space is spanned by the N eigen vectors.

In some embodiments, determining the covariance matrix $R_y$, of the signal vector y(k), is in accordance with $R_y=E[y(k) y^H(k)]$, where E is a statistical expectation operator; and an M×N matrix, V, is determined that comprises the N eigen vectors corresponding to the N greatest eigen values of the covariance matrix, $R_y$. Determining V can be in accordance with $R_y V=V\Lambda_{max}$, wherein the N-dimensional sub-space is spanned by the N eigen vectors in V, whereby the signal vector, y(k), is projected onto the N-dimensional sub-space in accordance with $z(n)=V^H y(n)$, wherein $V^H$ is the Hermitian transpose of the M×N matrix, V, and z(n) is the decimated signal.

BRIEF DESCRIPTION OF THE DRAWINGS

The objects and advantages of the invention will be understood by reading the following detailed description in conjunction with the drawings in which.

DETAILED DESCRIPTION

Figure 1:
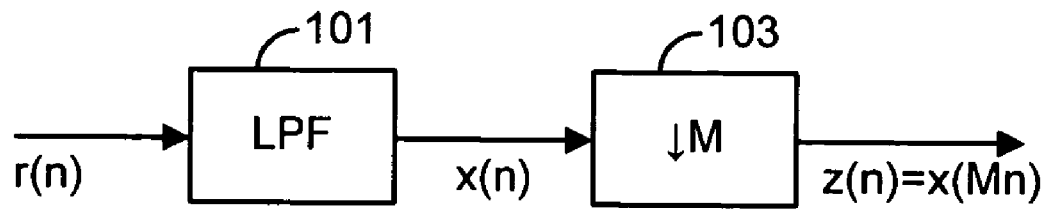
FIG. 1 is a block diagram of a conventional arrangement for decimating a baseband signal.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, or optical disk containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

As mentioned in the Background section, conventional signal decimation techniques try to do no more than preserve the spectrum integrity of the desired baseband signal. To do this, a starting point (predetermined phase) in the sequence of digital signal samples is selected, and the Nyquist principle is applied in a purely temporal way: that is, every M-th signal sample is retained, and the rest are discarded. In contrast to this rigid approach, the inventor has recognized that, because of oversampling, the original sequence of digital signal samples is a polyphase signal. The inventor has accordingly devised a different decimation scheme that makes it possible to preserve the spatial information in the decimated signal.

In one aspect, this is made possible by determining a signal vector of size M from the original sequence of digital signal samples, where each element of the vector is a signal constructed with the same sampling phase. Decimation is then performed by projecting this M-dimensional vector onto a sub-space having fewer than M dimensions. This last step is called "sub-space projection."

Figure 2:
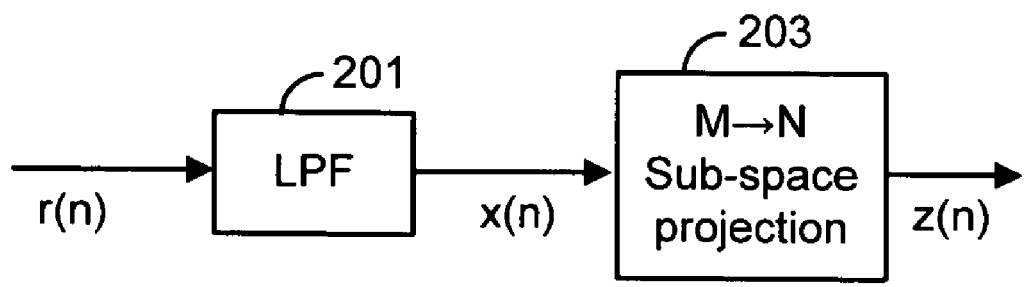
FIG. 2 is a block diagram of an arrangement for decimating a baseband signal using sub-space projection.

FIG. 2 is a block diagram of the arrangement for decimating a baseband signal using sub-space projection. A low pass filter (LPF) 201 with a normalized cut-off frequency of π/M is used to reduce the bandwidth of the signal before the sub-space projection circuit 203 is applied, where M is the number of dimensions of the original vector, and N is the number of dimensions of the resultant vector after sub-space projection. The term "circuit" has been used in the preceding sentence; however, it will be recognized that, while some embodiments may incorporate an actual piece of dedicated hardware to perform this function, alternative embodiments may instead use other techniques, such as general purpose processors executing a suitable set of program instructions supplied, for example, from a memory device or other source.

By performing "M-to-N" sub-space projection, integer as well as integer fractional decimation is possible. For example, if N=1, then integer decimation is performed, wherein the dimension of the signal sub-space is reduced to 1. However, if N is an integer greater than 1 and less than M, then either integer fractional decimation or integer decimation is accomplished. More particularly, if M is not an integer multiple of N, then integer fractional decimation is accomplished. For example, a decimation rate of 8/3 can be easily achieved by projecting the 8-dimensional signal onto a 3-dimensional signal sub-space. Of course, many other fractions are also obtainable, and are a function of the values of M and N.

As a purely mathematical exercise, sub-space projection is well-known, and need not be described here. See, for example, A. F. Naguib, et al., "Adaptive Channel Equalization for TDMA Digital Cellular Communications Using Antenna Arrays", *Proceedings of ICASSP '94*, vol. 4, pp. 101-104, 1994. It has also been found to be useful when applied to the problem of improving channel estimation and subsequent space-time equalization performance in receivers having multiple antenna elements. In this respect, the number of antennas must exceed the rank of the channel. But, where this is the case, the received signal can be treated as a vector having a desired signal part and a noise part. Sub-space projection is then used to eliminate the noise part. (By way of contrast, the present inventor has determined that the rank of the propagation channel is irrelevant with respect to using sub-space projection to perform signal decimation.) Those interested in learning more about the application of sub-space projection to the problem of improving channel estimation are invited to refer to Erik Lindskog and Claes Tidestav, "Reduced Rank Channel Estimation," *IEEE Proc. VTC '99*, pp. 1126-30, May 17-21, 1999 (Houston, Tex.). The Lindskog and Tidestav document does not, however, address or even mention the problem of signal decimation.

In another aspect, sub-space projection can be done in a way that optimizes the signal-to-noise ratio (SNR) of the decimated signal. An exemplary technique for doing this will now be described with reference to the flow diagram of FIG. 3. While, in this example, decimation by an integer amount is illustrated (i.e., N=1), those skilled in the art will readily understand how to adapt the following to perform fractional decimation. In the following discussion, the setting of N=1 means that in some instances, vector rather than matrix variables are implied. To make this more evident to the reader, the conventional notation in which vectors are represented by lowercase bold lettering, and matrices are represented by uppercase bold lettering is used. It will be appreciated that when N>1 (i.e., those embodiments in which matrices rather than vectors are implied for certain variables) or simply to denote the general case in which N≧1, the same equations would instead be represented with uppercase bold lettering in place of the lowercase bold lettering.

In one step (step 301), the samples that make up the polyphase signal x(n) are partitioned according to their sampling phases. A signal vector of size M is then constructed according to $$y(k) = [y_0(k) y_1(k) \ldots y_{M-1}(k)]^T, \quad (1)$$

where each element of the vector is a signal constructed with the same sampling phase, according to $$y_i(k) = x(kM+i). \quad (2)$$

The covariance matrix of the vector signal y(k) is obtained (step 303) by taking auto and cross correlation of the signal elements, according to $$R_y = E[y(k) y^H(k)], \quad (3)$$

where E is a statistical expectation operator and $y^H(k)$ is the Hermitian transpose of the vector signal y(k).

The undecimated signal x(n), or its vector representation is thus contained in an M-dimensional space. Decimating the signal, then, is equivalent to reducing the dimension of the signal space to 1. This much is in accordance with a broad aspect of the invention, and may be done by projecting the signal x(n) onto any one of the M dimensions. However, to optimize the SNR of the decimated signal, instead of taking a signal of any arbitrary or predefined phase, the signal vector is projected onto the dimension that maximizes the signal energy. This is done (step 305) by calculating the eigen vector that corresponds to the greatest eigen value of the covariance matrix $$R_y v = v \lambda_{max}. \quad (4)$$

The optimized decimation signal z(n) is then obtained (step 307) by projection in accordance with $$z(n) = v^H y(n), \quad (5)$$

where $v^H$ is the Hermitian transpose of the eigen vector v.

Figure 3:
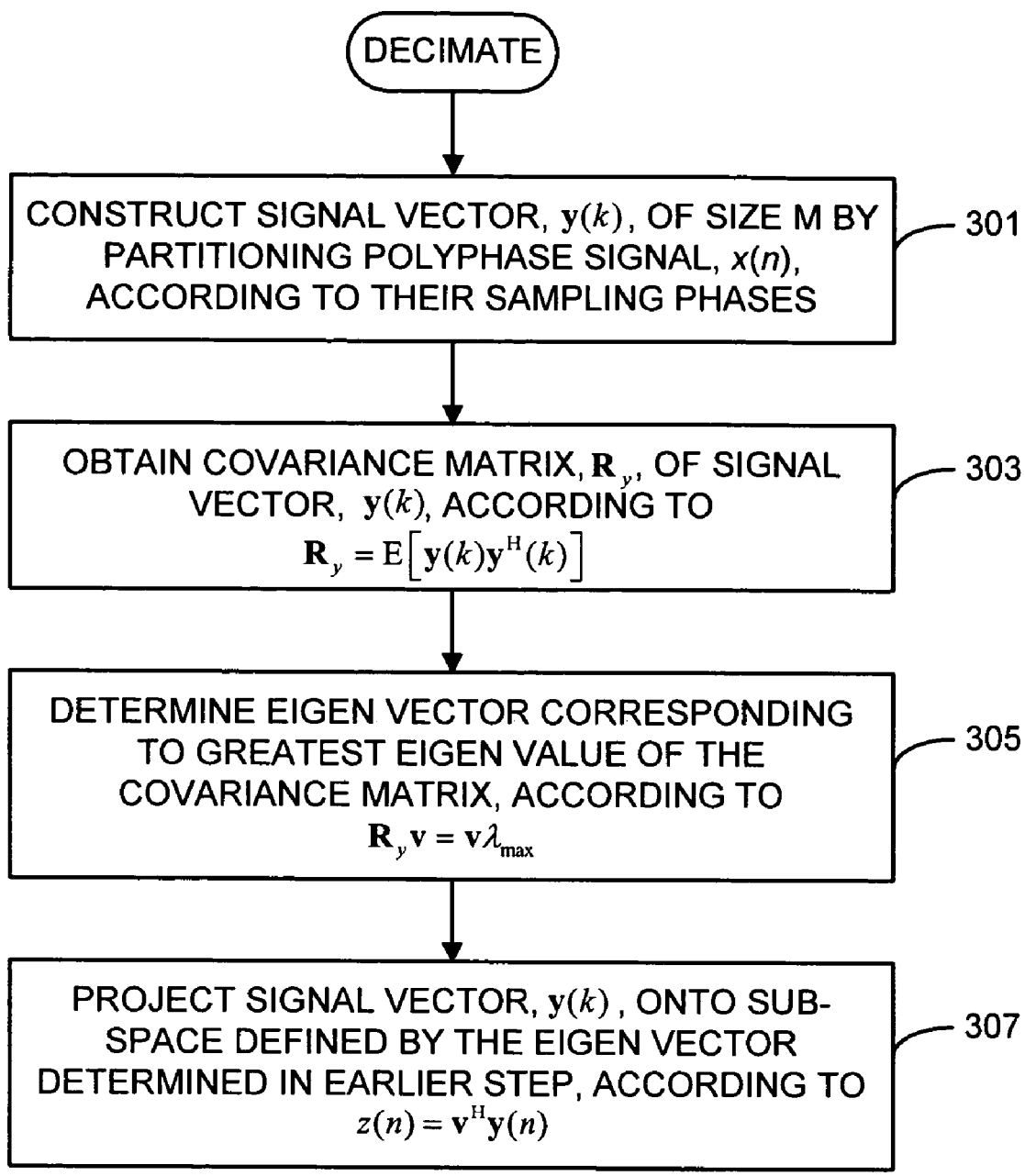
FIG. 3 is a flow diagram of an exemplary method for decimating a signal in a way that optimizes the signal-to-noise ratio (SNR) of the decimated signal.

As mentioned above, the exemplary embodiment described with reference to FIG. 3 illustrates the special case of decimation by an integer amount (i.e., N=1). When fractional decimation is to be performed (i.e., 1<N<M), V will be an M×N matrix, and $\Lambda_{max}$ is a diagonal matrix of dimension N×N.

Figure 4:
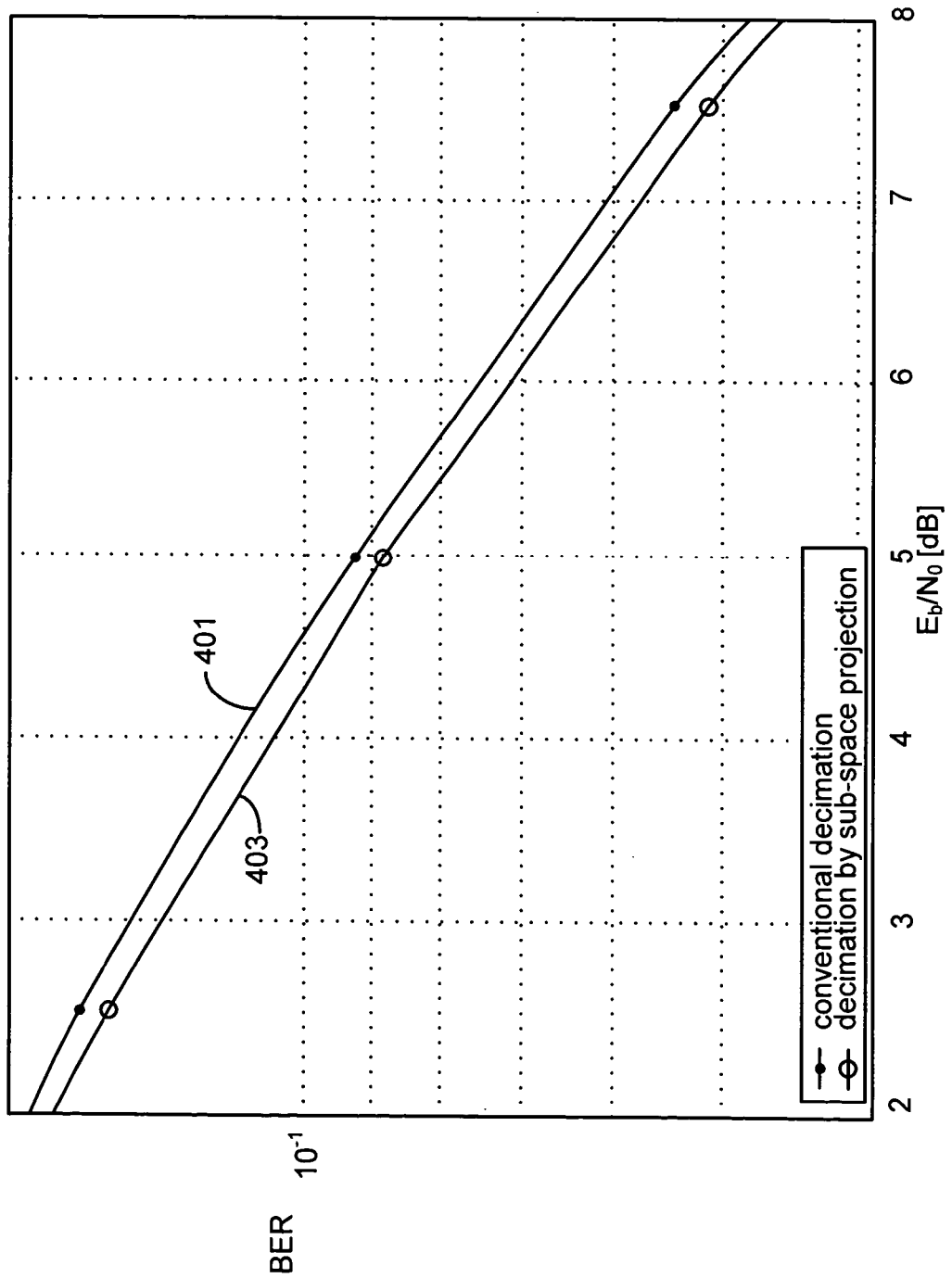
FIG. 4 depicts graphs of Bit Error Rate as a function of Signal-to-Noise ratio for two cases: one in which a baseband signal at symbol rate was obtained by conventional decimation of an oversampled signal; and another in which the symbol rate signal was generated by decimation of the oversampled signal with the sub-space projection decimation techniques described herein.

Decimation by means of signal sub-space projection can also be considered a maximal combination of the polyphase signal with regard to SNR at the decimation point. Testing has shown that a clear performance improvement is obtained in channels with both pure additive white noise and/or with strong interference. FIG. 4 is a graph illustrating the results of a test of decimation by sub-space projection. The testing determined the sensitivity performance for full-rate speech, using a typical urban channel model. It was further presumed that the mobile unit was traveling at 50 km/h, and using a 900 MHz carrier with ideal frequency hopping. The Carrier-to-Interference ratio (C/I) was 200 dB. Additionally, the mobile unit was a homodyne receiver, so a DC offset was further presumed.

A first graph (graph 401) shows the bit error rate (BER) as a function of signal-to-noise ratio when conventional decimation techniques are used to generate a baseband signal at symbol rate from an oversampled signal. As expected, the BER decreases as the signal-to-noise ratio increases.

As can be seen in a second graph (graph 403), the same relationship holds when the above-described sub-space projection techniques are applied to decimate the oversampled signal to again yield a baseband signal at symbol rate. However, it can also be seen that an improved (i.e., lower) BER is achieved when sub-space projection is used, compared to the case where conventional decimation was performed.

Other observations that can be made about the various aspects described herein involving the use of sub-space projection to perform signal decimation are:

The technique is independent of the modulation/multiplexing form of the received signal. Thus, it can be applied, for example, to GSM, WCDMA and other radio link systems.

The computational complexity of the approach is low and numerically stable.

The invention has been described with reference to a particular embodiment. However, it will be readily apparent to those skilled in the art that it is possible to embody the invention in specific forms other than those of the preferred embodiment described above.

For example, the equations presented herein in connection with the exemplary embodiments all deal with right eigen vectors. However, alternative embodiments can be constructed using left eigen vectors. This is possible due to the symmetric property of the covariance matrix. Thus, the signal vector, y(k), can be defined as a row vector instead of a column vector, and the covariance matrix can be defined differently by changing the signal vector order, that is, $$R_y = E[y^H(k) y(k)].$$

The covariance matrix thus defined will be in a conjugate form of the earlier-defined one. The eigen equation will then be in the form, $$V R_y = \Lambda_{max} V,$$

where V is an N×M matrix. Sub-space projection is then performed in accordance with $$z(n) = y(n) V^H.$$

Due to the symmetrical property, $R_y$ is a Hermitian matrix, and the left and right eigen vector versions are equivalent.

Thus, the described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of decimating a digital signal, x(n), where n is an integer, the method comprising:
   generating the digital signal, x(n), as part of a radio communication process;
   determining a signal vector, y(k), of size M by partitioning samples of the digital signal, x(n) according to sampling phases of the samples, wherein each element of the signal vector, y(k), is a signal constructed with a same sampling phase;
   projecting the signal vector, y(k), onto an N-dimensional sub-space, wherein N is an integer and N<M;
   determining a covariance matrix $R_y$, of the signal vector y(k);
   determining N eigen vectors corresponding to N greatest eigen values of the covariance matrix, $R_y$, wherein the N-dimensional sub-space is spanned by the N eigen vectors; and
   determining an M×N or N×M matrix V, comprising the N eigen vectors,
   wherein the signal vector, y(k), is projected onto the N-dimensional sub-space in accordance with $z(n)=V^H y(n)$ or $z(n)=y(n)V^H$, wherein $V^H$ is the Hermitian transpose of the matrix, V, and z(n) is a decimated signal.

2. The method of claim 1, wherein N=1.

3. The method of claim 1, wherein 1<N<M, whereby fractional decimation is performed.

4. The method of claim 1, wherein:
   determining the covariance matrix $R_y$, of the signal vector y(k), is in accordance with $R_y=E[y(k)y^H(k)]$ or $R_y=E[y^H(k)y(k)]$, where E is a statistical expectation operator, and $y^H(k)$ is the Hermitian transpose of the signal vector y(k); and
   determining an M×N or N×M matrix, V, comprising the N eigen vectors, is in accordance with $R_y V = V\Lambda_{max}$ or $VR_y = \Lambda_{max}V$, wherein the N-dimensional sub-space is spanned by the N eigen vectors in V.

5. The method of claim 4, wherein N=1.

6. A method of receiving a radio frequency signal, comprising:
   demodulating the radio frequency signal to generate an analog baseband signal;
   generating a digital signal, x(n), from the analog baseband signal; and
   performing a method of decimating the digital signal, x(n), where n is an integer, to generate a decimated digital signal from the digital signal, x(n), wherein the method of decimating the digital signal, x(n), comprises:
   determining a signal vector, y(k), of size M by partitioning samples of the digital signal, x(n) according to sampling phases of the samples, wherein each element of the signal vector, y(k), is a signal constructed with a same sampling phase;
   projecting the signal vector, y(k), onto an N-dimensional sub-space, wherein N is an integer and N<M;
   determining a covariance matrix $R_y$, of the signal vector y(k);
   determining N eigen vectors corresponding to N greatest eigen values of the covariance matrix, $R_y$, wherein the N-dimensional sub-space is spanned by the N eigen vectors; and
   determining an M×N or N×M matrix V, comprising the N eigen vectors,
   wherein the signal vector, y(k), is projected onto the N-dimensional sub-space in accordance with $z(n)=V^H y(n)$ or $z(n)=y(n)V^H$, wherein $V^H$ is the Hermitian transpose of the matrix, V, and z(n) is a decimated signal.

7. A decimator that decimates a digital signal, x(n), where n is an integer, the decimator comprising:
   logic that generates the digital signal, x(n), as part of a radio communication process;
   logic that determines a signal vector, y(k), of size M by partitioning samples of the digital signal, x(n) according to sampling phases of the samples, wherein each element of the signal vector, y(k), is a signal constructed with a same sampling phase;
   logic that projects the signal vector, y(k), onto an N-dimensional sub-space, wherein N is an integer and N<M;
   logic that determines a covariance matrix $R_y$, of the signal vector y(k);
   logic that determines N eigen vectors corresponding to N greatest eigen values of the covariance matrix, $R_y$, wherein the N-dimensional sub-space is spanned by the N eigen vectors; and
   logic that determines an M×N or N×M matrix, V, comprising the N eigen vectors,
   wherein the signal vector, y(k), is projected onto the N-dimensional sub-space in accordance with $z(n)=V_H y(n)$ or $z(n)=y(n)V^H$, wherein $V^H$ is the Hermitian transpose of the matrix, V, and z(n) is a decimated signal.

8. The decimator of claim 7, wherein N=1.

9. The decimator of claim 7, wherein 1<N<M, whereby fractional decimation is performed.

10. The decimator of claim 7, wherein:
    the logic that determines the covariance matrix $R_y$, of the signal vector y(k), does so in accordance with $R_y=E[y(k)y^H(k)]$ or $R_y=E[y^H(k)y(k)]$, where E is a statistical expectation operator, and $y^H(k)$ is the Hermitian transpose of the signal vector y(k); and
    the logic that determines an M×N or N×M matrix, V, comprising the N eigen vectors, does so in accordance with $R_y V = V\Lambda_{max}$ or $VR_y = \Lambda_{max}V$, wherein the N-dimensional sub-space is spanned by the N eigen vectors in V.

11. The decimator of claim 10, wherein N=1.

12. A radio receiver comprising:
    a demodulator that generates an analog baseband signal from a received radio frequency signal;
    a circuit that generates a digital signal, x(n), from the analog baseband signal; and a decimator that decimates the digital signal, x(n), where n is an integer, wherein the decimator generates a decimated digital signal from the digital signal, x(n), and wherein the decimator comprises:

logic that determines a signal vector, y(k), of size M by partitioning samples of the digital signal, x(n) according to sampling phases of the samples, wherein each element of the signal vector, y(k), is a signal constructed with a same sampling phase;

logic that projects the signal vector, y(k), onto an N-dimensional sub-space, wherein N is an integer and N<M;

logic that determines a covariance matrix $R_y$, of the signal vector y(k);

logic that determines N eigen vectors corresponding to N greatest eigen values of the covariance matrix, $R_y$, wherein the N-dimensional sub-space is spanned by the N eigen vectors; and logic that determines an M×N or N×M matrix, V, comprising the N eigen vectors, wherein the signal vector, y(k), is projected onto the N-dimensional sub-space in accordance with $$z(n)=V^H y(n)$$ or $$z(n)=y(n)V^H,$$

wherein $V^H$ is the Hermitian transpose of the matrix, V, and z(n) is a decimated signal.

13. The radio receiver of claim 12, wherein N=1.

* * * * *

UNITED STATES PATENT AND TRADEMARK OFFICE
CERTIFICATE OF CORRECTION

PATENT NO. : 7,599,978 B2 Page 1 of 1
APPLICATION NO. : 10/883671
DATED : October 6, 2009
INVENTOR(S) : He It is certified that error appears in the above-identified patent and that said Letters Patent is hereby corrected as shown below:

In Column 7, Line 19, in Claim 1, delete "matrix" and insert -- matrix, --, therefor.

In Column 7, Line 42, in Claim 4, delete "$R_yV=VA_{max}$" and insert -- $R_yV=V\Lambda_{max}$ --, therefor.

In Column 8, Line 5, in Claim 6, delete "matrix" and insert -- matrix, --, therefor.

In Column 8, Line 36, in Claim 7, delete "$z(n)=V_Hy(n)$" and insert -- $z(n)=V^Hy(n)$ --, therefor.

In Column 8, Line 56, in Claim 10, delete "$R_yV=VA_{max}$" and insert -- $R_yV=V\Lambda_{max}$ --, therefor.

Signed and Sealed this

Second Day of February, 2010

David J. Kappos
*Director of the United States Patent and Trademark Office*